(12) United States Patent
Davenport

(10) Patent No.: US 7,609,113 B2
(45) Date of Patent: Oct. 27, 2009

(54) CONSTANT CURRENT BIAS CIRCUIT AND ASSOCIATED METHOD

(75) Inventor: William H. Davenport, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 186 days.

(21) Appl. No.: 11/599,932

(22) Filed: Nov. 15, 2006

(65) Prior Publication Data

US 2008/0111629 A1 May 15, 2008

(51) Int. Cl.
*H03F 3/04* (2006.01)
(52) U.S. Cl. .................... 330/296; 327/545; 327/540
(58) Field of Classification Search ............. 330/296, 330/295; 327/545, 540
See application file for complete search history.

(56) References Cited

U.S. PATENT DOCUMENTS

| 5,973,568 | A * | 10/1999 | Shapiro et al. ............ 330/295 |
| 6,369,656 | B2 | 4/2002 | Dening et al. |
| 6,369,657 | B2 | 4/2002 | Dening et al. |
| 6,404,287 | B2 | 6/2002 | Dening et al. |
| 6,566,954 | B2 | 5/2003 | Miyazawa |
| 6,744,321 | B2 | 6/2004 | Noh et al. |
| 6,803,822 | B2 | 10/2004 | Kim et al. |
| 6,842,074 | B2 | 1/2005 | Matsuno et al. |
| 6,842,075 | B2 | 1/2005 | Johnson et al. |
| 6,917,246 | B2 | 7/2005 | Thompson |
| 7,009,453 | B2 * | 3/2006 | Kuriyama .................... 330/289 |
| 7,109,800 | B2 | 9/2006 | Noh et al. |

* cited by examiner

*Primary Examiner*—Michael B Shingleton
(74) *Attorney, Agent, or Firm*—Booth Udall, PLC

(57) ABSTRACT

A constant current bias circuit and associated method is disclosed. The constant current bias circuit comprises an output stage for amplifying a radio frequency (RF) signal, wherein the output stage is operably coupled with a voltage. The constant current bias circuit further comprises a bias circuit operably coupled with the output stage for generating a substantially constant current bias to the output stage. The constant current bias circuit still further comprises a plurality of bias transistors operably coupled with the voltage and the output stage.

18 Claims, 4 Drawing Sheets

CONSTANT CURRENT BIAS CIRCUIT AND ASSOCIATED METHOD

TECHNICAL FIELD OF THE INVENTION

Embodiments of the present invention relate generally to radio frequency (RF) power amplifier bias networks and more specifically, to a constant current bias circuit and associated method.

BACKGROUND OF THE INVENTION

Radio frequency (RF) power amplifiers are often used in various portable applications, such as for example, cellular telephones and other wireless devices. In these applications, the operating voltages of the RF power amplifiers are typically provided by a battery. However, the operating voltages tend to fluctuate, either increase or decrease, as a function of various factors, such as for example, input power, temperature, or the discharge of the battery. This fluctuation of the operating voltages presents performance challenges in the design of the RF power amplifiers.

In RF power amplifiers, for example, Global System for Mobile Communications (GSM) and Digital Communication System (DCS) enhanced data rates for GSM evolution (EDGE) RF power amplifiers, the RF power amplifier is designed so that it meets certain performance criteria. In order to meet the performance criteria, conventional bias circuits provide bias voltages and currents to the inputs of the amplifying transistors of the RF power amplifier. However, these conventional bias circuits are often sensitive to the variations in the operating voltages of the wireless device. Bias circuit sensitivity to the operating voltages is undesirable.

In order to achieve the performance criteria for the RF power amplifier, the conventional bias circuits require precise voltage and current sources. However, one of the disadvantages with this approach is that in order to provide these precise voltage and current sources additional precision components and/or complex precision circuitry must be added to the conventional bias circuit design. These precision components and/or complex precision circuitry add additional cost to the design and are undesirable.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of embodiments of the present invention. Those skilled in the art will recognize that embodiments of the present invention provide many inventive concepts and novel features that are merely illustrative and not to be construed as restrictive. Accordingly, the specific embodiments discussed herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the present invention.

Figure 1:
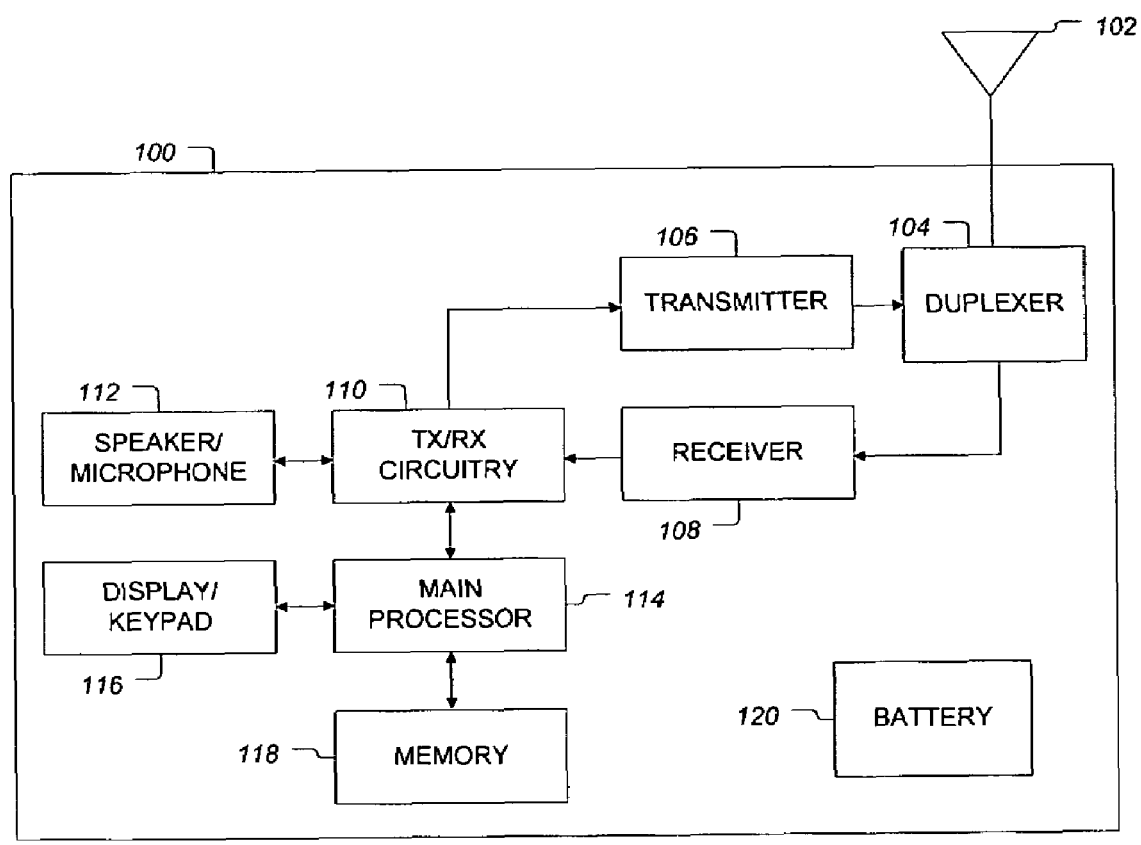
FIG. 1 illustrates a high-level block diagram of a wireless device according to an exemplary embodiment of the present invention.

FIG. 1 illustrates a high-level block diagram of a wireless device 100 according to an exemplary embodiment of the present invention. In one embodiment, wireless device 100 comprises an antenna 102, a duplexer 104, a transmitter 106, a receiver 108, TX/RX circuitry 110, a speaker/microphone 112, a main processor 114, a display/keypad 116, a memory 118, and a battery 120. Wireless device 100 may be any wireless device, including, but not limited to, conventional cellular telephones, paging devices, personal digital assistant devices, text-messaging devices, portable computers, or any other like device capable of wireless communication.

As will be explained below in greater detail, transmitter 106 comprises radio frequency (RF) power amplifier circuitry including bias circuitry, one or more RF power amplifier stages, and other like circuitry. In one embodiment of the present invention, the RF power amplifier circuitry of transmitter 106 is formed on a Gallium Arsenide (GaAs) substrate. However, other semiconductor materials (e.g., silicon, indium phosphide, gallium nitride) may be used. In addition, for purposes of illustration and ease of explanation, embodiments of the present invention are described in terms of bipolar junction transistor (BJT) technology (e.g., heterojunction bipolar transistors (HBTs)). However, embodiments of the invention may be practiced using other transistor technology, including, for example, but not limited to, field effect transistor (FET) technology (e.g., metal-semiconductor field effect transistors (MESFETs) and pseudomorphic high electron mobility transistors (pHEMTs)) or complementary metal-oxide semiconductor (CMOS) technology.

TX/RX circuitry 110 receives from antenna 102 an incoming signal transmitted by, for example, a communication system or a wireless network provider, through duplexer 104 and receiver 108. TX/RX circuitry 110 processes and sends the incoming signal to the speaker (i.e., voice data) or to main processor 114 (e.g., web browsing) for further processing. Likewise TX/RX circuitry 110 receives analog or digital voice data from the microphone or other outgoing data (e.g., web data, e-mail) from main processor 114. TX/RX circuitry 110 transmits an RF signal that is transmitted through transmitter 106 via antenna 102.

Main processor 114 executes a basic operating system program stored in memory 118 in order to control the overall operation of wireless device 100. For example, main processor 114 controls the reception of signals and the transmission of signals by TX/RX circuitry 110, receiver 108, and transmitter 106. Main processor 114 is capable of executing other processes and programs resident in memory 118 and may move data into or out of memory 118.

Main processor 114 is also coupled to display/keypad 116. The user of wireless device 100 uses the keypad to enter data into wireless device 100. The display may be a liquid crystal display capable of rendering text and/or at least various graphics; alternate embodiments may use other types of displays. Battery 120 is coupled with the electrical components of wireless device 100, in accordance with known electrical principles.

Those skilled in the art will recognize that wireless device 100 is given by way of example and that for simplicity and clarity, only so much of the construction and operation of wireless device 100 as is necessary for an understanding of the present invention is shown and described. In addition, or as an alternative, although an exemplary wireless device 100 is shown and described, embodiments of the present invention contemplate any suitable component or combination of components performing any suitable tasks in association with wireless device 100. Moreover, it is understood that wireless device 100 should not be construed to limit the types of devices in which embodiments of the present invention may be implemented.

In accordance with the principles of embodiments of the present invention, the RF power amplifier circuitry of transmitter 106 generates a constant current bias independent of input power, temperature, or fluctuations in the battery voltage, as described below in greater detail.

Figure 2:
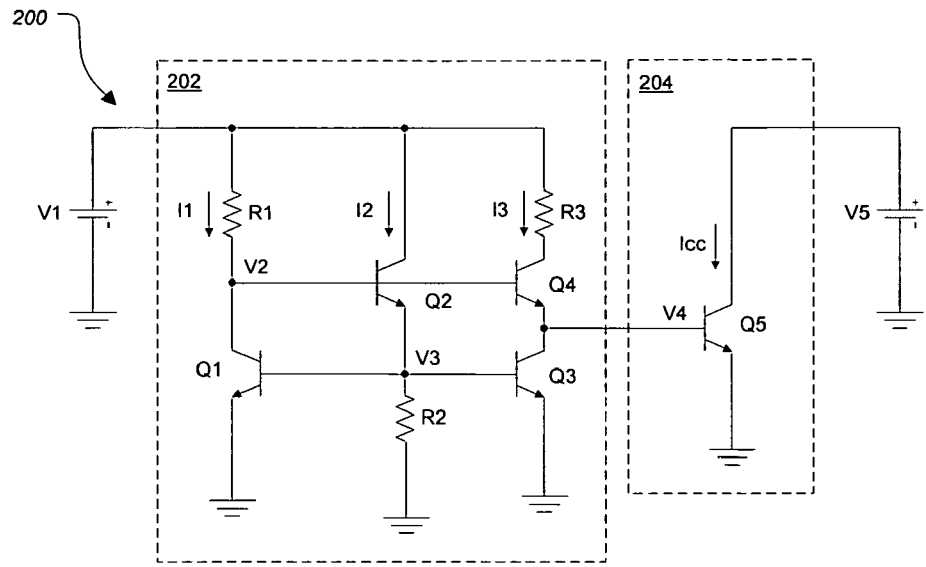
FIG. 2 illustrates a schematic diagram of a constant current bias circuit according to an embodiment of the present invention.

FIG. 2 illustrates a schematic diagram of a constant current bias circuit 200 according to an embodiment of the present invention. Constant current bias circuit 200 comprises a bias circuit 202, an output stage 204, and supply voltages V1 and V5. Bias circuit 202 comprises transistors Q1-Q4 and resistors R1-R3. Although constant current bias circuit 200 is shown and described as having resistors R1-R3, embodiments of the present invention contemplate any number of resistors or combination of resistors and components. In addition, although resistors R1-R3 are shown and described as resistive elements, embodiments of the present invention contemplate any suitable impedance element or combination of impedance elements performing the same or substantially similar functions as resistors R1-R3. Output stage 204 comprises transistor Q5. For simplicity and clarity, only a single transistor Q5 of output stage 204 is shown and described. Although output stage 204 is shown and described as having a single transistor Q5, embodiments of the present invention contemplate any number of transistors or combination of transistors and components.

In one embodiment of the present invention, transmitter 106 of wireless device 100 of FIG. 1 comprises RF power amplifier circuitry, including constant current bias circuit 200. In addition or as an alternative, transistor Q5 is an output stage of an RF power amplifier associated with the RF power amplifier circuitry of wireless device 100. In addition, supply voltage V5 may be a regulated supply voltage and may be, for example, regulated to a predetermined voltage range. For example, the regulated supply voltage may be controlled or contained within a predetermined voltage range and thereby allowing supply voltage V5 to remain substantially constant at that predetermined voltage range.

In one embodiment of the present invention, supply voltages V1 and V5 may vary, i.e., either increase or decrease in voltage. As an example only and not by way of limitation, supply voltages V1 and V5 may be the voltage of battery 120, wherein the voltage may vary due to, for example, input power, temperature, or the discharge of the battery voltage, in which case supply voltages V1 and V5 also experience a fluctuation in voltage. In addition, as supply voltage V1 varies, current I1 through resistor R1 varies in order to maintain a voltage V2 of 2*Vbe. A portion of current I1 forms the base current for transistors Q2 and Q4, while the remainder of current I1 passes through transistor Q1 to ground, as defined by the feedback of transistor Q2 coupled to the base of transistor Q1.

In addition, resistor R2 provides a path to ground for reference current I2 through transistor Q2, while keeping the magnitude of reference current I2 substantially constant and higher than the required base currents for transistors Q1 and Q3. Voltage V3 is one base-emitter voltage (Vbe) above ground as defined by the base voltage required to keep the majority of current I1 flowing through transistor Q1. Current I3 through transistor Q3 mirrors current I1 through transistor Q1 in proportion to the size of transistors Q1 and Q3.

Transistors Q3 and Q4 are connected in a cascaded manner. Transistor Q4 is biased substantially similar to transistor Q2 via voltage V2. As will be discussed below, cascaded transistors Q3 and Q4 should be substantially equal in size. Current I3 in cascaded transistors Q3 and Q4 is proportional to current I1 through resistor R1. In this manner, resistor R3 should be substantially proportional as to resistor R1 as current I1 is to current I3, in order to maintain an equal voltage drop across resistors R1 and R3. In addition or as an alternative, although current I3 is shown and described as flowing through resistor R3 and cascaded transistors Q3 and Q4, embodiments of the present invention contemplate the collector of transistor Q4 coupled directly to supply voltage V1. In this manner, current I3 in cascaded transistors Q3 and Q4 is proportional to current I1 through resistor R1.

To further explain the operation of constant current bias circuit 200, an example is now given. In the following example, the battery voltage of battery 120 of wireless device 100 experiences a voltage fluctuation caused by, for example, input power, temperature, or the discharge of battery 120. Supply voltage V1 is coupled to battery 120, and therefore also experiences a voltage fluctuation. As supply voltage V1 varies (i.e. increases or decreases in voltage), current I3 through resistor R3 proportionally mirrors current I1 through resistor R1. The base-emitter voltage of transistor Q1 (VbeQ1) sustains current I1, which varies proportionally with supply voltage V1 minus the base current of transistors Q2 and Q4. The base-emitter voltage of transistor Q2 (VbeQ2) sustains reference current I2 which is composed of the base currents for transistors Q1 and Q3 plus the current V3/R2. In addition, if reference current I2 is substantially larger than the sum of the base current of transistors Q1 and Q3, then reference current I2 is substantially dependent on VbeQ1 and the value of resistor R2.

It is important to note that as supply voltage V1 varies, current I1 will also vary; however, reference current I2 and voltage VbeQ2 remain substantially constant. As mentioned above, if cascaded transistors Q3 and Q4 should be substantially equal in size, in which case the base-emitter voltage of transistor Q4 (VbeQ4) equals the base-emitter voltage of transistor Q3 (VbeQ3), and therefore VbeQ4 equals VbeQ1. In addition, since voltage V2 is 2*Vbe (i.e., VbeQ1+VbeQ2), then voltage V4 (i.e., the voltage at the base of transistor Q5) equals VbeQ2, which is V2−VbeQ4. Accordingly, since voltage V4 equals VbeQ2, collector current $I_{cc}$ through transistor Q5 is proportional to reference current I2 through transistor Q2 by the size ratio of transistor Q5 to Transistor Q2, and is substantially independent of variations in supply voltage V1.

Figure 3:
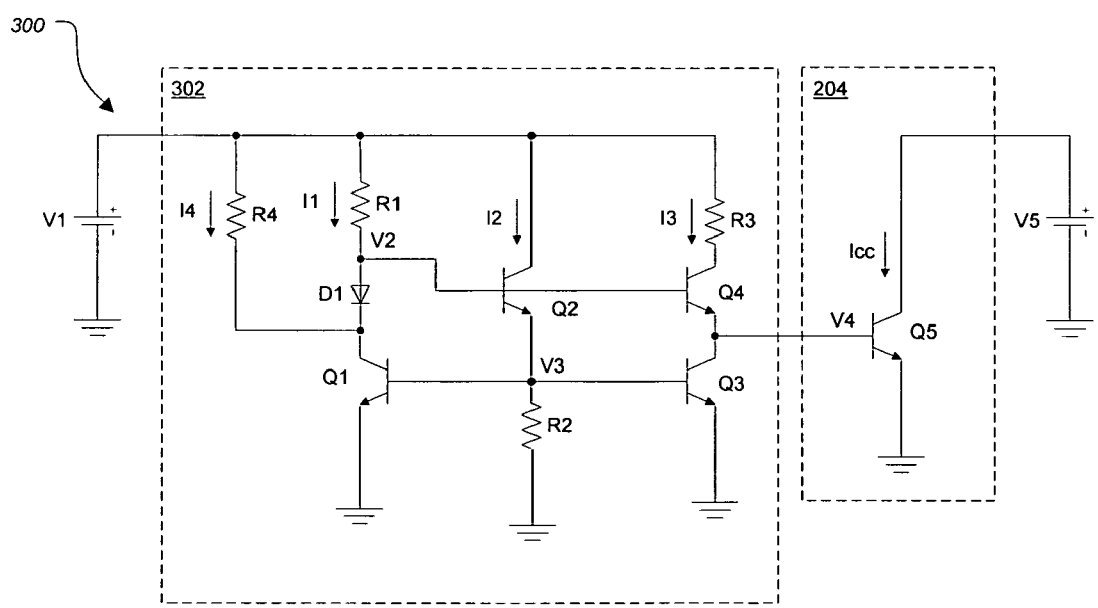
FIG. 3 illustrates a schematic diagram of a constant current bias circuit according to one embodiment of the present invention.

FIG. 3 illustrates a schematic diagram of a constant current bias circuit 300 according to another embodiment of the present invention. Constant current bias circuit 300 comprises a bias circuit 302, output stage 204, and supply voltages V1 and V5. Bias circuit 302 comprises transistors Q1-Q4, resistors R1-R4, and a diode D1. Although constant current bias circuit 300 is shown and described as having resistors R1-R4, embodiments of the present invention contemplate any number of resistors or combination of resistors and components. In addition, although resistors R1-R4 are shown and described as resistive elements, embodiments of the present invention contemplate any suitable impedance element or combination of impedance elements performing the same or substantially similar functions as resistors R1-R4. As indicated above with respect to FIG. 2, output stage 204 comprises transistor Q5.

In one embodiment of the present invention, transmitter 106 of wireless device 100 of FIG. 1 comprises RF power amplifier circuitry including constant current bias circuit 300. In addition or as an alternative, transistor Q5 is an output stage of an RF power amplifier associated with the RF power amplifier circuitry of wireless device 100. As discussed above, supply voltage V1 may vary, and even if supply voltage V1 varies, reference current I2 and voltage VbeQ2 remain substantially constant, VbeQ4 equals VbeQ1, voltage V2 is 2*Vbe (i.e. VbeQ1+VbeQ2), and thus voltage V4 equals VbeQ2. Therefore, collector current $I_{cc}$ in transistor Q5 is proportional to reference current I2 in transistor Q2 by the size ratio of transistor Q5 to Transistor Q2, and is substantially independent of variations in supply voltage V1.

In another embodiment of the present invention, diode D1 and resistor R4 of bias circuit 302 provide increased power supply rejection for constant current bias circuit 300. Although a single diode D1 and a single resistor R4 is shown and described for adding supply rejection for constant current bias circuit 300, any number of diodes or resistors may be used. To further explain the increased power supply rejection for constant current bias circuit 300, an example is now given. In the following example, voltage V2 is at a higher voltage potential than the voltage at the collector of transistor Q1. However, the current through transistor Q1 is the sum of currents I1 plus I4 and therefore the current in transistor Q1 is additionally protected from fluctuation of supply voltage V1.

In addition or as an alternative, at low values of supply voltage V1, current I4 remains higher than current I1, which is reduced to a current level to sustain the base currents for transistors Q2 and Q4. In accordance with the principles of embodiments of the present invention, constant current bias circuit 300 may remain active to levels of supply voltage V1 that are 2*Vbe plus the base currents of transistors Q2 and Q4 times resistor R1. This allows current I2 to remain substantially constant as supply voltage V1 approaches 2*Vbe while still supplying adequate current to keep transistors Q1, Q3, and Q4 fully active. In addition to providing a more stable current I4, current I3 remains high enough to supply adequate base current to transistor Q5, so that collector current $I_{cc}$ remains substantially proportional to reference current I2 by for example, the size ratio of transistor Q5 to Transistor Q2, as supply voltage V1 fluctuates.

Figure 4:
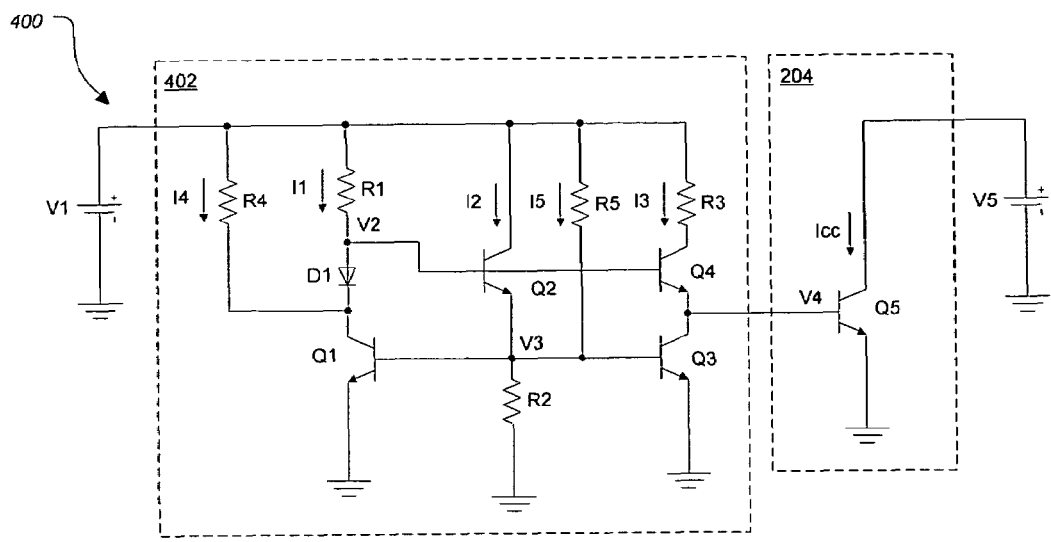
FIG. 4 illustrates a schematic diagram of a constant current bias circuit according to another embodiment of the present invention.

FIG. 4 illustrates a schematic diagram of a constant current bias circuit 400 according to another embodiment of the present invention. Constant current bias circuit 400 comprises a bias circuit 402, output stage 204, and supply voltages V1 and V5. Bias circuit 402 comprises transistors Q1-Q4, resistors R1-R5, and diode D1. Although constant current bias circuit 400 is shown and described as having resistors R1-R5, embodiments of the present invention contemplate any number of resistors or combination of resistors and components. In addition, although resistors R1-R5 are shown and described as resistive elements, embodiments of the present invention contemplate any suitable impedance element or combination of impedance elements performing the same or substantially similar functions as resistors R1-R5. As indicated above with respect to FIG. 2, output stage 204 comprises transistor Q5. In accordance with the embodiments of the present invention, resistor R5 of bias circuit 402 provides compensation for the base currents of transistors Q1 and Q3 via current I5, as the currents in transistors Q1 and Q3 vary with the variation of supply voltage V1.

In one embodiment of the present invention, transmitter 106 of wireless device 100 of FIG. 1 comprises RF power amplifier circuitry including constant current bias circuit 400. In addition or as an alternative, transistor Q5 is an output stage of an RF power amplifier associated with the RF power amplifier circuitry of wireless device 100. As discussed above, supply voltage V1 may vary, and even if supply voltage V1 varies, reference current I2 and voltage VbeQ2 remain substantially constant, VbeQ4 equals VbeQ1, voltage V2 is 2*Vbe (i.e. VbeQ1+VbeQ2), and thus voltage V4 equals VbeQ2. Therefore, collector current $I_{cc}$ in transistor Q5 is proportional to reference current I2 in transistor Q2 by the size ratio of transistor Q5 to Transistor Q2, and is substantially independent of variations in supply voltage V1.

In another embodiment of the present invention, resistor R5 compensates for any variation in the base currents of transistors Q1 and Q3 caused by variations in supply voltage V1. Any variation in the base current of transistors Q1 and Q3 may add uncertainty to collector current Icc in transistor Q5, which, as mentioned above, is proportional to current I2. Current I2 is composed of the currents V3/R2 and the base currents of transistors Q1 and Q3. Although a single resistor R5 is shown and described for compensating for the base current variation of transistors Q1 and Q3, any number of resistors may be used. As an example only and not by way of limitation, the sum of currents I4 and I1 through transistor Q1 may vary as a function of supply voltage V1, thereby causing the base current of transistor Q1 and consequently the base current of transistor Q3 to vary as a function of supply voltage V1. As mentioned above, as supply voltage V1 varies, current I5 varies through resistor R5. Accordingly, current I5 may be proportional to the base current requirements for transistors Q1 and Q3. In addition, any variation in the base currents of transistors Q1 and Q3 may be compensated by, for example, resistor R5. Therefore, collector current Icc of output stage 204 becomes desensitized to variations in supply voltage V1 through, for example, resistor R5.

Figure 5:
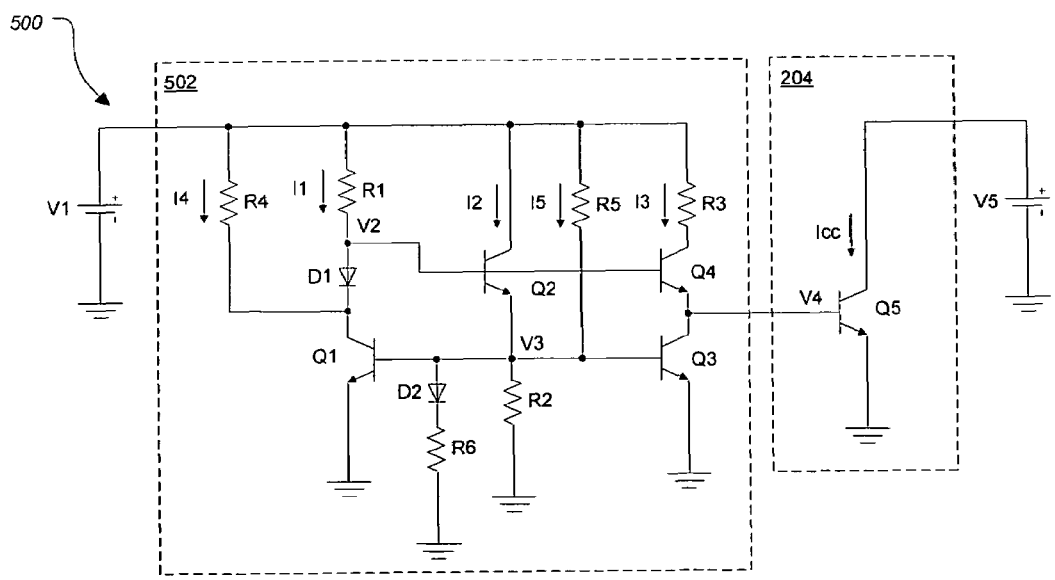
FIG. 5 illustrates a schematic diagram of a constant current bias circuit according to another embodiment of the present invention.

FIG. 5 illustrates a schematic diagram of a constant current bias circuit 500 according to another embodiment of the present invention. Constant current bias circuit 500 comprises a bias circuit 502, output stage 204, and supply voltages V1 and V5. Bias circuit 502 comprises transistors Q1-Q4, resistors R1-R6, and diodes D1 and D2. Although constant current bias circuit 500 is shown and described as having resistors R1-R6, embodiments of the present invention contemplate any number of resistors or combination of resistors and components. In addition, although resistors R1-R6 are shown and described as resistive elements, embodiments of the present invention contemplate any suitable impedance element or combination of impedance elements performing the same or substantially similar functions as resistors R1-R6. As indicated above with respect to FIG. 2, output stage 204 comprises transistor Q5. In addition, diode D2 and resistor R6 of bias circuit 502 provide temperature compensation for constant current bias circuit 500.

In one embodiment of the present invention, transmitter 106 of wireless device 100 of FIG. 1 comprises RF power amplifier circuitry including constant current bias circuit 500. In addition or as an alternative, transistor Q5 is an output stage of an RF power amplifier associated with the RF power amplifier circuitry of wireless device 100. As discussed above, supply voltage V1 may vary, and even if supply voltage V1 varies, reference current I2 and voltage VbeQ2 remain substantially constant, VbeQ4 equals VbeQ1, voltage V2 is 2*Vbe (i.e. VbeQ1+VbeQ2), and thus voltage V4 equals VbeQ2. Therefore, collector current $I_{cc}$ in transistor Q5 is proportional to reference current I2 in transistor Q2 by the size ratio of transistor Q5 to Transistor Q2, and is substantially independent of variations in supply voltage V1.

In another embodiment of the present invention, resistor R5 provides an injection of an error correction current I5 that is proportional to the variation of supply voltage V1. The error correction current I5 provides constant current bias circuit 500 with compensation for slight variations of voltage V2. In addition, error correction current I5 adjusts reference current I2 through transistor Q2 and the VbeQ2 which has been shown to be equal to voltage V4. As an example only and not by way of limitation, as supply voltage V1 increases, transistor Q2 provides additional base current to transistors Q1 and Q3. Error correction current I5 compensates for the increase in supply voltage V1 by providing the additional base current to transistors Q1 and Q3, thereby maintaining a constant current in transistor Q2.

In still another embodiment of the present invention, diode D2 and resistor R6 of bias circuit 502 provide temperature compensation for constant current bias circuit 500. Although a single diode D2 and a single resistor R6 is shown and described for compensating for the temperature variation of constant current bias circuit 500, any number of diodes or resistors may be used. As an example only and not by way of limitation, since voltage V3 or VbeQ3 varies as a function of temperature, reference current I2 through transistor Q2 may vary as a function of temperature as V3/R2. As described above, voltage V4 equals VbeQ2, and thus collector current Icc in transistor Q5, which is proportional to reference current I2 in transistor Q2, may also vary as a function of temperature.

Accordingly, the current through diode D2 increases or decreases in proportion to the change in temperature to the base-emitter voltage (Vbe) of transistors Q1 and Q3. For example, when the temperature increases in constant current bias circuit 500, and in particular, when the temperature increases in diode D2, additional current is pulled through diode D2 and resistor R6, thereby providing a substantially constant current in transistors Q2 and Q5. In addition or as an alternative, when the temperature decreases in diode D2, less current is pulled through diode D2 and resistor R6, thereby providing a substantially constant current in transistors Q2 and Q5. This compensating action reduces the variation in collector current Icc of output stage 204 over temperature.

Figure 6:
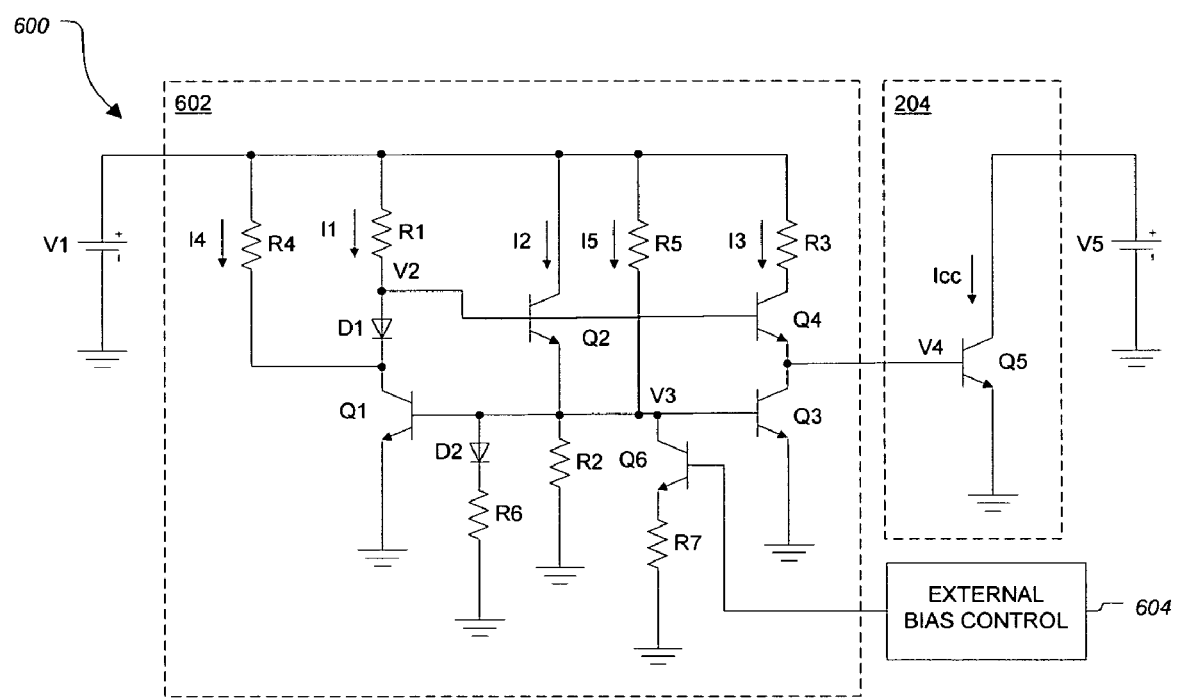
FIG. 6 illustrates a schematic diagram of a constant current bias circuit according to another embodiment of the present invention.

FIG. 6 illustrates a schematic diagram of a constant current bias circuit 600 according to another embodiment of the present invention. Constant current bias circuit 600 comprises a bias circuit 602, an external bias control 604, output stage 204, and supply voltages V1 and V5. Bias circuit 602 comprises transistors Q1-Q4 and Q6, resistors R1-R7, and diodes D1 and D2. Although constant current bias circuit 600 is shown and described as having resistors R1-R7, embodiments of the present invention contemplate any number of resistors or combination of resistors and components. In addition, although resistors R1-R7 are shown and described as resistive elements, embodiments of the present invention contemplate any suitable impedance element or combination of impedance elements performing the same or substantially similar functions as resistors R1-R7. As indicated above with respect to FIG. 2, output stage 204 comprises transistor Q5.

In one embodiment of the present invention, transmitter 106 of wireless device 100 of FIG. 1 comprises RF power amplifier circuitry including constant current bias circuit 600. In addition or as an alternative, external bias control 604 may be part of TX/RX circuitry 110 of wireless device 100. As discussed above, supply voltage V1 may vary, and even if supply voltage V1 varies, reference current I2 and voltage VbeQ2 remain substantially constant. Furthermore, the error correction current I5 provides additional base current to transistors Q1 and Q3 thereby maintaining a constant current in transistor Q2. As described above, VbeQ4 equals VbeQ1, voltage V2 is 2*Vbe (i.e. VbeQ1+VbeQ2), and thus voltage V4 equals VbeQ2. Therefore, collector current $I_{cc}$ in transistor Q5 is proportional to reference current I2 in transistor Q2 by the size ratio of transistor Q5 to Transistor Q2, and is substantially independent of variations in supply voltage V1.

In another embodiment of the present invention, external bias control 604 provides for controlling or setting the bias of output stage 204 (i.e., transistor Q5). For example, by adjusting the bias voltage of transistor Q6, the current may be increased or decreased in transistor Q2, thereby enabling the bias of transistor Q5 to be adjusted and controlled within a predetermined range. As an example only and not by way of limitation, output stage 204 may be configured to operate in a low power setting (i.e., a low output power of transistor Q5). External bias control 604 decreases the base voltage of transistor Q6, which decreases the bias current in transistors Q2 and Q5, thereby providing for a low power operation of output stage 204. In addition or as an alternative, output stage 204 may be configured to operate in a high power setting (i.e., a high output power of transistor Q5). External bias control 604 increases the base voltage of transistor Q6, which increases the bias current in transistors Q2 and Q5, thereby providing for a high power operation of output stage 204. In addition, external bias control 604 provides for setting an output power of output stage 204.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of the present invention. Accordingly, the invention is not limited to the embodiments disclosed, but rather by the appended claims and their equivalents.

What is claimed is:

1. A constant current bias circuit, comprising:
   an output stage operably coupled with a first voltage, for amplifying a radio frequency (RF) signal; and
   a bias circuit operably coupled with the output stage, wherein the bias circuit comprises:
   a first bias transistor having a base and a collector, the collector of the first bias transistor operably coupled with a second voltage through a first impedance element;

a second bias transistor having a base, a collector, and an emitter, the base of the second bias transistor operably coupled with the collector of the first bias transistor, the collector of the second bias transistor operably coupled with the second voltage, and the emitter of the second bias transistor operably coupled with a ground through a second impedance element;

a third bias transistor having a base and a collector, the base of the third bias transistor operably coupled with the base of the first bias transistor and with the emitter of the second bias transistor; and a fourth bias transistor having a base, a collector, and an emitter, the base of the fourth bias transistor operably coupled with the collector of the first bias transistor, the collector of the fourth bias transistor operably coupled with the second voltage through a third impedance element, and the emitter of the fourth bias transistor operably coupled with the collector of the third bias transistor.

2. The circuit of claim 1, further comprising:
a diode operably coupled between the collector of the first bias transistor and the first impedance element, wherein the base of the second and fourth bias transistors are operably coupled between the diode and the first impedance element; and
a fourth impedance element operably coupled between the collector of the first bias transistor and the second voltage.

3. The circuit of claim 1, wherein the diode is a first diode, the bias circuit further comprises a second diode operably coupled between the base of the first bias transistor and the ground.

4. The circuit of claim 1, wherein the base of the third bias transistor is operably coupled through a fifth impedance element to the second voltage.

5. The circuit of claim 1, wherein the bias circuit further comprises:
a fifth bias transistor having a collector and an emitter, the collector of the fifth bias transistor is operably coupled with the base of the third bias transistor; and
a sixth impedance element operably coupled between the emitter of the fifth bias transistor and the ground.

6. The circuit of claim 5, wherein the fifth bias transistor further comprises a base, the base of the fifth bias transistor capable of being controlled by an external bias control.

7. The circuit of claim 6, wherein the external bias control provides for setting a predetermined output power of the output stage.

8. The circuit of claim 1, wherein the output stage comprises an output transistor having a base and a collector, the base of the output transistor operably coupled with the constant current bias circuit, and the collector of the output transistor operably coupled with the first voltage.

9. The circuit of claim 1, wherein the second voltage is a battery voltage.

10. The circuit of claim 9, wherein the first voltage is a battery voltage.

11. The circuit of claim 9, wherein the voltage is a regulated voltage.

12. The circuit of claim 1, wherein the constant current bias circuit is fabricated in Gallium Arsenide (GaAs).

13. A wireless device comprising:
a transmitter for transmitting RF signals, the transmitter comprising:
an output power amplifier stage; and
a bias circuit operably coupled with the output power amplifier stage, wherein the bias circuit comprises:
a first bias transistor having a base and a collector, the collector of the first bias transistor operably coupled through a first impedance element to a voltage;
a second bias transistor having a base, a collector, and an emitter, the base of the second bias transistor operably coupled with the collector of the first bias transistor, the collector of the second bias transistor operably coupled with the voltage, and the emitter of the second bias transistor operably coupled through a second impedance element to a ground;
a third bias transistor having a base and a collector, the base of the third bias transistor operably coupled with the base of the first bias transistor and to the emitter of the second bias transistor; and
a fourth bias transistor having a base, a collector, and an emitter, the base of the fourth bias transistor operably coupled with the collector of the first bias transistor, the collector of the fourth bias transistor operably coupled through a third impedance element to the voltage, and the emitter of the fourth bias transistor operably coupled with the collector of the third bias transistor; and a battery connected to the transmitter of the wireless device.

14. The wireless device of claim 13, wherein the bias circuit further comprises:
a diode operably coupled between the collector of the first bias transistor and the first impedance element, wherein the base of the second and fourth bias transistors are operably coupled between the diode and the first impedance element; and
a fourth impedance element operably coupled between the collector of the first bias transistor and the voltage.

15. The wireless device of claim 13, wherein the diode is a first diode, the bias circuit further comprises a second diode operably coupled between the base of the first bias transistor and the ground.

16. The wireless device of claim 13, wherein the base of the third bias transistor is operably coupled through a fifth impedance element to the battery.

17. The wireless device of claim 13, wherein the bias circuit further comprises:
a fifth bias transistor having a base, a collector, and an emitter, the collector of the fifth bias transistor operably coupled with the base of the third bias transistor; and
a sixth impedance element operably coupled between the emitter of the fifth bias transistor and the ground, wherein the base of the fifth bias transistor is capable of being controlled by an external bias control.

18. The wireless device of claim 13, wherein the output power amplifier stage comprises an output transistor having a base and a collector, the base of the output transistor operably coupled with the bias circuit, and the collector of the output transistor operably coupled with the battery.

* * * * *